US007371964B2

(12) United States Patent
Albou et al.

(10) Patent No.: US 7,371,964 B2
(45) Date of Patent: May 13, 2008

(54) LIGHTING AND/OR SIGNALLING DEVICE WITH LIGHT EMITTING DIODES FOR MOTOR VEHICLES

(75) Inventors: Pierre Albou, Paris (FR); Christophe Chenevier, Versailles (FR); Alexandre Mensales, Montmagny (FR); Eric Moisy, Vaivre et Montoille (FR)

(73) Assignee: Valeo Vision, Bobigny (FR)

(*) Notice: Subject to any disclaimer, the term of this patent is extended or adjusted under 35 U.S.C. 154(b) by 0 days.

(21) Appl. No.: 11/419,588

(22) Filed: May 22, 2006

(65) Prior Publication Data

US 2007/0035957 A1 Feb. 15, 2007

(30) Foreign Application Priority Data

May 23, 2005 (FR) .................................. 05 05162

(51) Int. Cl.
*H05K 7/20* (2006.01)

(52) U.S. Cl. ..................................................... 174/16.3

(58) Field of Classification Search ............... 174/16.3; 362/545, 547

See application file for complete search history.

(56) References Cited

U.S. PATENT DOCUMENTS

| | | | | |
|---|---|---|---|---|
| 4,729,076 | A * | 3/1988 | Masami et al. | 362/235 |
| 6,639,360 | B2 * | 10/2003 | Roberts et al. | 313/512 |
| 7,114,837 | B2 * | 10/2006 | Yagi et al. | 362/523 |
| 2004/0240217 | A1 | 12/2004 | Rice | |
| 2005/0122735 | A1 | 6/2005 | Watanabe et al. | |
| 2006/0215416 | A1 * | 9/2006 | Lucas et al. | 362/545 |

FOREIGN PATENT DOCUMENTS

| | | |
|---|---|---|
| FR | 2 797 678 | 2/2001 |

* cited by examiner

*Primary Examiner*—Chau N. Nguyen
(74) *Attorney, Agent, or Firm*—Jacox, Meckstroth & Jenkins

(57) ABSTRACT

The invention concerns a lighting and/or signalling device for motor vehicles comprising a housing equipped with a plurality of light emitting diodes mounted on a movable plate, at least one device for cooling the said diodes, comprising at least one first fixed heat sink, at least one second movable heat sink, and at least one means for effecting a forced air convection between the first radiator or heat sink and the second radiator or heat sink.

18 Claims, 1 Drawing Sheet

LIGHTING AND/OR SIGNALLING DEVICE WITH LIGHT EMITTING DIODES FOR MOTOR VEHICLES

BACKGROUND OF THE INVENTION

1. Field of the Invention

The invention concerns a lighting or signalling device for motor vehicles in which the light source is produced by means of light emitting diodes. The invention also concerns a motor vehicle comprising such a lighting or signalling device.

The invention finds applications in the automotive field and, in particular, in the field of lighting and signalling for motor vehicles.

2. Description of the Related Art

Generally a motor vehicle comprises at least two lighting devices situated at the front of the vehicle, also called headlights, and signalling devices situated at the front and rear of the vehicle. Each lighting or signalling device comprises a housing closed by a protective lens and equipped firstly with a light source emitting a light beam and secondly optical elements for directing this light beam. Currently, in the majority of lighting or signalling devices, the light source is produced by means of a lamp, such as a discharge lamp, halogen lamp etc. Lighting and signalling devices therefore each comprise a single lamp or possibly two lamps for main-beam lighting.

These lamps have the advantage of having a high efficiency and high luminance. However, they have the drawback of emitting a high level of heat locally. Consequently they each constitute in the lighting or signalling devices, a source of heat with a very hot single concentrated point. For example, in the case of a halogen lamp, the filament of the lamp has a temperature of around 3,000° C., the glass balloon of the bulb has a temperature above 400° C. and the bulb cap has a temperature around 200° C. These lamps also have the drawback of emitting infrared rays.

Moreover, in order to increase further their light yield and to direct their light beams, these lamps are generally placed close to a mirror. This mirror is conventionally metal or metallised, which further concentrates the heat and infrared rays emitted by the lamp. In addition, these infrared rays are directed towards the exit face of the lighting or signalling device, namely the protective lens, which heats up under the effect of these rays. In addition, if the protective lens is dirty, the lens absorbs these infrared rays instead of transmitting them, which concentrates the heat further. Consequently the protective lens of the device must be produced from a material that is particularly resistant to heat.

The casings of the lighting or signalling devices must be perfectly impervious to ambient moisture, in particular rain, snow, etc. It is therefore difficult to ventilate the inside of the housing in order to cool it.

In order to resolve these problems of concentrated heat, it is possible to produce light sources using light emitting diodes. Such a light source is produced by means of a plurality of light emitting diodes, or LEDs, associated in modules and mounted on a fixed or movable plate. The temperature attained by a light emitting diode is around 100° C. to 150° C. Such a light source has the advantage of offering high efficiency, able to achieve that of conventional lamps, and where the heat is distributed over all the modules. This is because, the light emitting diodes being grouped together in modules within the housing, the light source is formed from several luminous points distributed in the whole of the housing. The heat emitted by the light source is therefore distributed in the whole of the housing, which avoids the existence of a single concentrated heat point.

In addition, the distribution of the luminous points in the housing makes it possible to direct the corresponding light beams in the required directions, without necessarily using an enveloping mirror. The heat emitted by such a light source is thus dispersed rather than shielded.

In addition, light emitting diodes are electronic components which have the advantage of not emitting near infrared rays (in the range 1 to 5 μm), which locally minimises the heat emitted by the light source.

However, even if the temperature of a light emitting diode is relatively low compared with the temperature of a conventional lamp and even if the hot spots are distributed in the housing, it is also necessary to cool such a light source. In order to cool electronic components, and in particular power diodes, it is known how to mount the component to be cooled on a radiator or heat sink. A radiator or heat sink is associated with each component. The component is then cooled with ambient air. In the case where the component is a light emitting diode mounted in a vehicle lighting or signalling device, the ambient air is the air of the housing of the device. It is therefore relatively hot (at a temperature around 95° to 100° C.). It is consequently necessary to use a radiator or heat sink of relatively large size in order to cool this component sufficiently.

The use of such a radiator or heat sink can be envisaged when the plate on which the light emitting diodes are mounted is fixed. However, in the majority of current vehicles, the light source is orientable to allow correction of the light range. In particular, with a DBL (Bending Light) system, the light source must be able to be oriented to the right or to the left of the vehicle so that the lighting follows the path of the road. The light source can also be orientable towards the top or bottom of the vehicle in order to take account of the attitude of the vehicle. In these cases, the light emitting diodes are mounted on a movable plate, moved by a motor. However, if each light emitting diode must be mounted on the movable mounting plate with the radiator or heat sink, of relatively large size, which is associated with it, then the movable plate becomes heavy and the motor moving it must be powerful.

In order to limit the weight of the movable mounting plate, it is envisaged dividing the light source into several modules, each module comprising its own movable plate. In this case, it is possible to use less powerful motors for each module. On the other hand, it is necessary to use one motor for each movable mounting plate, which considerably increases the cost of each device. In addition, the use of several motors simultaneously causes a problem of slaving the assembly to an initial position.

In order to improve the cooling of the electronic components, and in particular the power diodes, the document U.S. Pat. No.-B2-6,639,360 proposes associating fans with the radiators or heat sinks. More precisely, this document proposes to place, under each light emitting diode, a radiator or heat sink with which there is associated a fan providing a circulation of air propagated by the radiator or heat sink. In this case, each radiator or heat sink must be of smaller dimensions. However, the weight saved by the use of a smaller radiator or heat sink is at least partly compensated for by the addition of a fan. The problem of weight of the movable plate to be moved remains identical to the problems stated above.

There is, therefore, a need to provide a lighting and signalling device that overcomes one or more of the problems in the prior art.

SUMMARY OF THE INVENTION

The aim of the invention is precisely to remedy the drawbacks of the devices described above. To this end, the invention proposes a lighting and/or signalling device whose light source is produced by means of light emitting diodes cooled by a circulation of cooled air between at least two radiators or heat sinks. More precisely, the device of the invention comprises a first radiator or heat sink of relatively large size, mounted fixed in the housing of the device, with one end situated preferably close to a cold spot of the vehicle, and at least one second radiator or heat sink mounted so as to be able to move, close to the light emitting diodes. A forced circulation of air is established between the two radiators or heat sinks in order to propagate the cooled air from the first radiator or heat sink to the second radiator or heat sink.

More precisely, the invention concerns a lighting and/or signalling device for a motor vehicle comprising a housing equipped with a plurality of light emitting diodes mounted on a movable plate and forming an orientable light source, with at least one device for cooling said diodes. In accordance with one embodiment of the invention, the cooling device comprises at least one first fixed radiator or heat sink situated preferably partially in the vicinity of a cold spot of the vehicle, at least one second movable radiator or heat sink mounted close to the diodes, on at least one means for producing a forced convection of air between the first radiator or heat sink and a second radiator or heat sink.

The invention can also comprise one or more of the following characteristics:

- convection means is placed upstream of the first and second radiators or heat sinks;
- convection means comprises a fan;
- a first radiator or heat sink comprising a part external to a housing and a part inserted in the housing;
- one end of the first radiator or heat sink is situated at the front of the vehicle;
- one end of the first radiator or heat sink is situated on one side of the vehicle, close to a wing of the vehicle;
- each diode is mounted, individually or in a module, on a second radiator or heat sink;
- a second radiator or heat sink is integrated directly in each diode;
- the second radiator or heat sink is fixed to the mounting plate;
- the second radiator or heat sink forms the mounting plate;
- the second radiator or heat sink is more compact than the first radiator or heat sink.

The invention also concerns a motor vehicle comprising a device as described above.

These and other objects and advantages of the invention will be apparent from the following description, the accompanying drawings and the appended claims.

DETAILED DESCRIPTION OF EMBODIMENTS OF THE INVENTION

Figure 1:
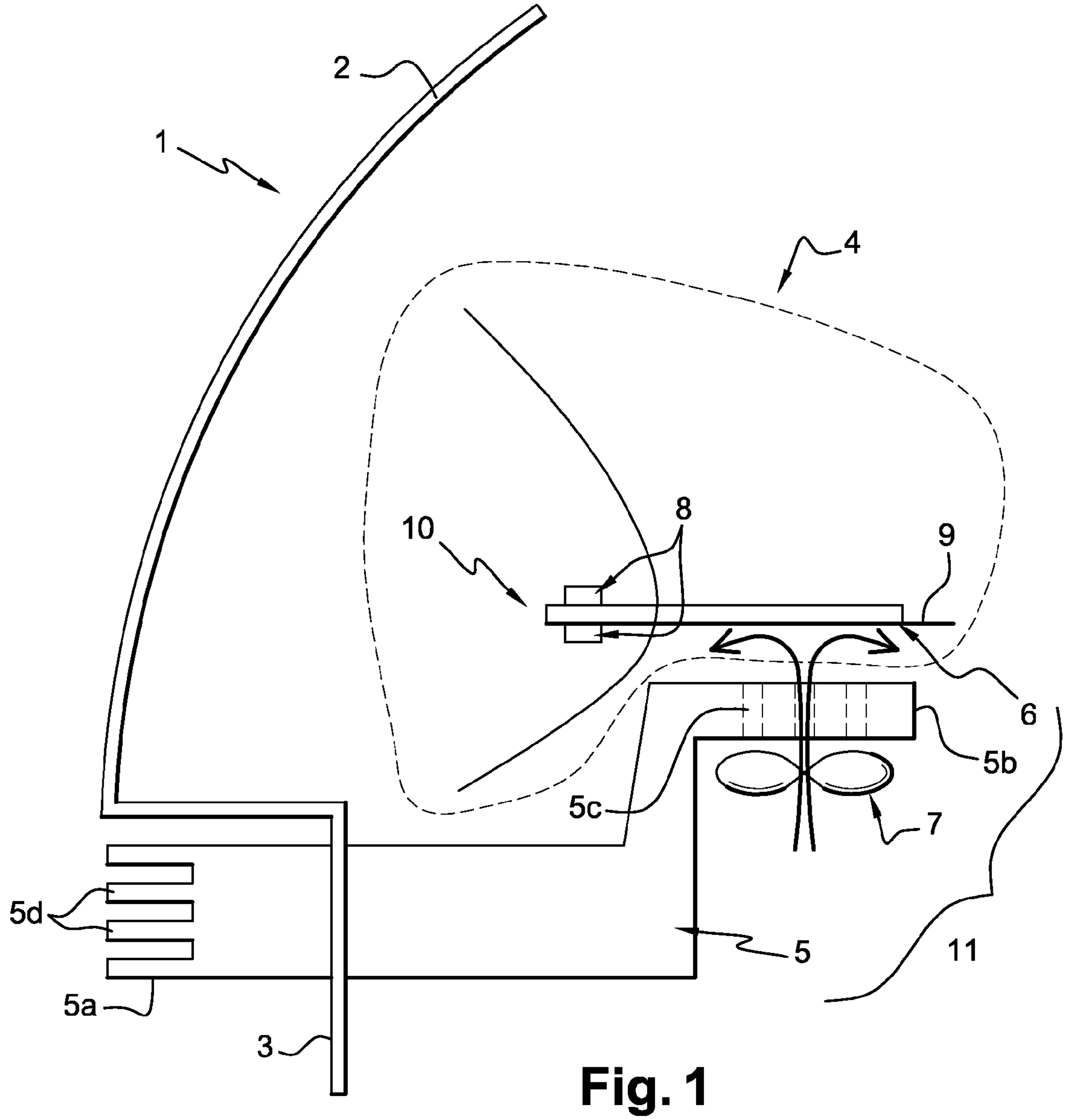
FIG. 1 depicts schematically an example of a lighting device comprising a light source with light emitting diodes cooled in accordance with the invention.

FIG. 1 depicts an example of a lighting device, also referred to as a headlight, equipped with a light source with light emitting diodes and a cooling device according to the invention. This headlight 1 comprises a moisture-tight housing 3 closed by a protective lens 2 forming an exit face of the housing. This housing 3 is generally produced from a plastic material. The protective lens 2 is mounted sealingly on the housing 3. Inside the housing 3 a light source 10 is produced by means of a plurality of light emitting diodes 8. This light source 10 is able to move inside the housing 3. The orientation of the light source 10 is obtained by virtue of a motor, not shown in the figure.

The light emitting diodes 8, referred to more simply as LEDs or diodes, can be mounted separately or on the other hand grouped together in the form of modules. The modules can be dispersed inside the housing 3. In the headlight of FIG. 1, the diodes 8 are mounted on a movable plate 9 actuated by the motor. The diodes 8, or the diode modules, therefore form, with the plate 9, a movable assembly 4.

In the example in FIG. 1, the diodes 8 are cooled by a cooling device 11. This cooling device 11 comprises:

- a first radiator or heat sink 5, fixed in the headlight,
- at least one second radiator or heat sink 6, able to move in the headlight, and
- a means for producing a circulation of air between these two radiators or heat sinks.

The fixed radiator or heat sink 5 is mounted in the headlight 1 so that one end 5*a* of the radiator or heat sink 5 is placed close to a cold spot of the vehicle. In other words, one end of this fixed radiator or heat sink 5 is placed in a cooled area of the vehicle, for example at the front of the vehicle. In the example in FIG. 1, the fixed radiator or heat sink 5 passes through the housing 3, in a thermally sealed fashion, so that the end 5*a* of the radiator or heat sink emerges at the front of the vehicle. In this case, the end 5*a* of the fixed radiator or heat sink 5 forms an integral part of the vehicle bumper. The end 5*a* of the fixed radiator or heat sink 5 can also be situated at the join between the protective lens 2 and the vehicle bumper. These locations at the front of the vehicle have the advantage of profiting from an arrival of always cool air due to the movements of the vehicle.

The fixed radiator or heat sink 5 can also be placed in the headlight so that its end 5*a* emerges on one side of the vehicle, for example under the wing of the vehicle. Such a place has the advantage of being sheltered by the sheet metal forming the wing of the vehicle whilst being cooled continuously by the movement of wheels.

The fixed radiator or heat sink 5 can be inserted in the housing 3 when the housing is manufactured, by insert molding of a plastic around the metal forming the radiator or heat sink. In other words, the radiator or heat sink can, for example, be an insert placed in an injection mold for the housing. The fixed radiator or heat sink can be produced from any overmoldable materials, allowing good thermal transmission, such as silver, copper, aluminum (in particular, extruded aluminum) or other new materials such as composite materials.

This fixed radiator or heat sink 5 has a shape which may be non-flat. The shape of this radiator or heat sink is chosen so that the second end 5*b* of the radiator or heat sink is placed close to the movable assembly 4 of the headlight 1. In this way, the coolness generated at the first end 5*a* of the radiator or heat sink causes heat transfers coming from the second end 5*b* of the radiator or heat sink so as to generate cooling in the vicinity of the movable assembly 4.

For better reception of the coolness external to the headlight, the end 5*a* of the fixed radiator or heat sink 5 can comprise fins 5*d*.

The cooling device 11 also comprises one or more second radiators or heat sinks 6 installed in the movable assembly 4 of the headlight. This second radiator or heat sink 6 is able to move in the headlight, with respect to the fixed radiator or heat sink 5. This movable radiator or heat sink 6 is compact compared with the fixed radiator or heat sink 5. It can therefore be easily actuated by a motor.

The movable radiator or heat sink 6 is placed opposite the second end 5*b* of the fixed radiator or heat sink 5. Thus the cold transmitted by the fixed radiator or heat sink 5 from its end 5*a* to its end 5*b* cools the ambient air surrounding the end 5*b* and therefore the movable radiator or heat sink 6 which is situated facing this end 5*b*. For better transmission of the cold, it is desirable to put the cold body, namely the fixed radiator or heat sink 5, as close as possible to the diodes, the limit being dictated by the movement of the movable radiator or heat sink during rotations of the movable part.

The movable radiator or heat sink 6 can be mounted on the plate 9, as shown in FIG. 1. It can also be produced so that it constitutes itself the plate of the headlight. A rotation spindle is then mounted on the radiator or heat sink 6 in order to connect the movable radiator or heat sink 6 to the motor.

The movable radiator or heat sink 6 is placed close to the diodes 8 or diode modules. More precisely, each diode 8 or diode module is mounted on a movable radiator or heat sink. One and the same movable radiator or heat sink 6 can receive one diode or several diodes. In other words, a movable radiator or heat sink 6 is used to cool one or two diodes in the case where the diode is mounted individually in the housing. A movable radiator or heat sink 6 is used to cool a diode module or several diode modules in the case where the diode is grouped together in modules. In the example in FIG. 1, the movable radiator or heat sink 6 provides the cooling of a pair of diode modules 8 placed on each side of the radiator or heat sink.

The cooling device 11 also comprises a means 7 for creating a forced air convection between the fixed radiator or heat sink 5 and the movable radiator or heat sink 6. This convection means 7 provides a circulation of the air cooled by the fixed radiator or heat sink 5 towards the movable radiator or heat sink 6. The movable radiator or heat sink 6 transmits this cooled air to the diodes 8. The forced circulation of air between the two radiators or heat sinks is shown by arrows in FIG. 1.

In a preferred embodiment of the invention, the convection means 7 is a fan placed upstream of the fixed and movable radiators or heat sinks. In this way, the fan stirs the cooled air surrounding the second end 5*b* of the fixed radiator or heat sink 5 and directs it towards the second radiator or heat sink. In this way a forced circulation of cooled air is created between the fixed radiator or heat sink and the movable radiator or heat sink. In other words, the fan 7 is installed under the fixed radiator or heat sink 5 so as to force the passage of air over this cold body and to direct this flow of air as directly as possible over the movable radiator or heat sink 6.

For better circulation of air between the two radiators or heat sinks, the end 5*b* of the fixed radiator or heat sink 5 can comprise through holes 5*c*.

In another embodiment of the invention, several fixed radiators or heat sinks can be mounted in the same headlight and associated with several fans. Not all the fans necessarily function at the same time, in particular if not all the diodes or diode modules are functioning at the same time.

The cooling device 11 that has just been described creates a cold spot inside the housing 3 by thermal conductivity and forces the circulation of an air flow, cooled by this cold spot, towards the inside of the movable part.

In this cooling device 11, the junction between the fixed radiator or heat sink and the movable radiator or heat sink is achieved by a forced circulation of air. There is therefore no mechanical junction between the two radiators or heat sinks, which prevents any risk of interaction between the movable part and the fixed part of the headlight.

The absence of any mechanical element also lightens the weight of the movable part. The weight of the movable part, that is to say the suspended weight, is also lightened by the fact that the only movable elements are the diodes 8, the movable radiator or heat sink 6 and possibly the plate 9. The movable radiator or heat sink 6 can be relatively lightweight since it is cooled by cooled air. This radiator or heat sink 6 can even, according to a variant, be a radiator or heat sink integrated directly in the diode. The heavy elements, namely the fan and the fixed radiator or heat sink, are not movable. Their weight therefore has no effect on the headlight of the invention.

In addition, this cooling device 11 makes it possible to heat the protective lens 2 of the headlight. This is because, since the diodes are not emitting any infrared rays, the protective lens 2 of the headlight is not heated. Thus, in winter, when there is snow or frost, or condensation, the protective lens 2 cannot defrost. The snow and frost do not melt. The condensation does not evaporate. In the cooling device 11, the forced air flow towards the movable radiator or heat sink 6 is partly discharged towards the diodes 8. Close to the diodes 8, this air flow heats up and then reaches the protective lens, which it heats. Under the effect of this heated air flow, the snow and frost melt and the condensation evaporates.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. A lighting and/or signalling device for a motor vehicle, comprising a housing comprising:

a plurality of light emitting diodes mounted on a movable mounting plate and forming an orientable light source, at least one cooling device for cooling said plurality of light emitting diodes, wherein said at least one cooling device comprises:

at least one first fixed heat sink, situated partially in the vicinity of a cold spot of the vehicle;

at least one second movable heat sink mounted in the vicinity of the diodes; and at least one means for effecting a forced air convection between the at least one first fixed heat sink and the at least one second movable heat sink; at least a portion of said at least one first fixed heat sink being situated in a generally opposed and spaced relationship to said at least one second movable heat sink in order to cool said at least one second movable heat sink.

2. The device according to claim 1, wherein said at least one means is placed upstream of said at least one first fixed heat sink and said at least one second movable heat sink.

3. The device according to claim 1, wherein said at least one means for effecting a forced air convection comprises a fan.

4. The device according to claim 1, wherein said at least one first fixed heat sink comprises a part external to the housing and a part inserted in the housing.

5. The device according to claim 1, wherein each of said plurality of light emitting diodes is mounted, individually or in a module, on said at least one second movable heat sink.

6. The device according to claim 1, wherein said at least one second movable heat sink is integrated to or associated to directly each of said plurality of light emitting diodes.

7. The device according to claim 1, wherein said at least one second movable heat sink is fixed to said movable mounting plate.

8. The device according to claim 1, wherein said at least one second movable heat sink forms said movable mounting plate.

9. The device according to claim 1, wherein said at least one second movable heat sink is larger than the first heat sink.

10. A motor vehicle, comprising at least one lighting and/or signalling device according to claim 1.

11. A lighting and/or signalling device for a motor vehicle, comprising a housing comprising:

a plurality of light emitting diodes mounted on a movable mounting plate and forming an orientable light source, at least one cooling device for cooling said plurality of light emitting diodes, wherein said at least one cooling device comprises:

at least one first fixed heat sink, situated partially in the vicinity of a cold spot of the vehicle;

at least one second movable heat sink mounted in the vicinity of the diodes;

at least one means for effecting a forced air convection between the at least one first fixed heat sink and the at least one second movable heat sink;

wherein said at least one first fixed heat sink comprises a part external to the housing and a part inserted in the housing; and wherein one end of said at least one first fixed heat sink is situated at a front of the vehicle.

12. A lighting and/or signalling device for a motor vehicle, comprising a housing comprising:

a plurality of light emitting diodes mounted on a movable mounting plate and forming an orientable light source;

at least one cooling device for cooling said plurality of light emitting diodes, wherein said at least one cooling device comprises:

at least one first fixed heat sink, situated partially in the vicinity of a cold spot of the vehicle;

at least one second movable heat sink mounted in the vicinity of the diodes;

at least one means for effecting a forced air convection between said at least one first fixed heat sink and said at least one second movable heat sink;

wherein said at least one first fixed heat sink comprises a part external to the housing and a part inserted in the housing; and wherein an end of said at least one first fixed heat sink is situated on one side of the vehicle, close to a wing of the vehicle.

13. A lighting or signaling device for use on a vehicle, said lighting or signaling device comprising:

a housing having a movable mount;

a plurality of light emitting diodes mounted on said movable mount;

a plurality of cooling elements associated with said plurality of light emitting diodes for facilitating cooling said plurality of light emitting; and said plurality of cooling elements comprising a fixed heat sink and a movable heat sink, said fixed heat sink having a surface area that is in a generally opposed and spaced relationship to said movable heat sink so that said fixed heat sink may cool said movable heat sink.

14. The lighting or signaling device as recited in claim 13 wherein said movable mount comprises said movable heat sink.

15. The lighting or signaling device as recited in claim 13 wherein said movable heat sink is situated in said housing.

16. The lighting or signaling device as recited in claim 13 wherein at least a portion of said fixed heat sink is situated outside said housing and a second portion of said fixed heat sink is situated inside said housing.

17. The lighting or signaling device as recited in claim 13 wherein said plurality of cooling elements comprises said fixed heat sink and said movable heat sink are generally opposed relationship to each other; said lighting or signaling device further comprising a fan for moving air between said fixed heat sink and said movable heat sink.

18. The lighting or signaling device as recited in claim 17 wherein at least a portion of said fixed heat sink is situated outside said housing and a second portion of said fixed heat sink is situated inside said housing in general opposed relationship to said movable heat sink.

* * * * *